(12) United States Patent
Chung et al.

(10) Patent No.: US 12,200,831 B2
(45) Date of Patent: Jan. 14, 2025

(54) HEATING FILM

(71) Applicants: HYUNDAI MOTOR COMPANY, Seoul (KR); KIA CORPORATION, Seoul (KR); KWANG JIN WINTEC CO., LTD., Busan (KR); SEOYON E-HWA CO., LTD., Anyang-si (KR); INTERFLEX CO., LTD., Ansan-si (KR)

(72) Inventors: So La Chung, Seoul (KR); Hyeon Kyu Yang, Hwaseong-si (KR); Man Ju Oh, Yongin-si (KR); Ho Cheol Choi, Busan (KR); Seung Joon Lee, Uiwang-si (KR); Jin Keum, Seoul (KR)

(73) Assignees: HYUNDAI MOTOR COMPANY, Seoul (KR); KIA CORPORATION, Seoul (KR); KWANG JIN WINTEC CO LTD, Busan (KR); SEOYON E-HWA CO LTD, Anyang-si (KR); INTERFLEX CO LTD, Anyang-si (KR)

( * ) Notice: Subject to any disclaimer, the term of this patent is extended or adjusted under 35 U.S.C. 154(b) by 844 days.

(21) Appl. No.: 17/374,068

(22) Filed: Jul. 13, 2021

(65) Prior Publication Data
US 2022/0039214 A1  Feb. 3, 2022

(30) Foreign Application Priority Data
Jul. 31, 2020  (KR) .................. 10-2020-0096077

(51) Int. Cl.
*H05B 3/36* (2006.01)
*B32B 3/10* (2006.01)
(Continued)

(52) U.S. Cl.
CPC .............. *H05B 3/36* (2013.01); *B32B 3/10* (2013.01); *B32B 3/266* (2013.01); *B32B 9/007* (2013.01);
(Continued)

(58) Field of Classification Search
CPC ........ H05B 2203/008; H05B 2203/011; H05B 2203/016; H05B 2214/04; H05B 3/145; H05B 3/267; H05B 3/36
(Continued)

(56) References Cited

U.S. PATENT DOCUMENTS 5,927,381 A    7/1999  Bednarek et al.
7,134,715 B1 * 11/2006 Fristedt .................. B60N 2/002
                                                   177/144
(Continued)

FOREIGN PATENT DOCUMENTS

JP    H09-63755 A    3/1997
JP    2009-063755 A  3/2009
(Continued)

OTHER PUBLICATIONS

Russian Notice of Allowance dated Feb. 28, 2022, issued in corresponding Russian Patent Application No. 2021121792.
(Continued)

*Primary Examiner* — Vy T Nguyen
(74) *Attorney, Agent, or Firm* — Morgan, Lewis & Bockius LLP

(57) ABSTRACT

A heating film may include a base layer made of polymer resin, a plurality of electrode lines spaced from each other and disposed on the base layer, a mesh-type support layer disposed between the electrode lines and made of a thermally conductive material, and a heating layer that has first and second end portions connected to the respective elec- (Continued)

trode lines, is made of a carbon composite material, and generates heat when powered.

15 Claims, 3 Drawing Sheets

(51) Int. Cl.
    *B32B 3/26*     (2006.01)
    *B32B 9/00*     (2006.01)
    *B32B 9/04*     (2006.01)
    *B32B 27/28*     (2006.01)
    *B60H 1/22*     (2006.01)
    *G01K 1/143*     (2021.01)
    *G06F 3/041*     (2006.01)
    *H05B 3/14*     (2006.01)

(52) U.S. Cl.
    CPC ............ *B32B 9/045* (2013.01); *B32B 27/281* (2013.01); *B60H 1/2218* (2013.01); *B60H 1/2226* (2019.05); *B60H 1/2227* (2019.05); *G01K 1/143* (2013.01); *G06F 3/04164* (2019.05); *B32B 2307/302* (2013.01); *B32B 2457/00* (2013.01); *H05B 3/145* (2013.01); *H05B 2203/008* (2013.01); *H05B 2203/011* (2013.01); *H05B 2203/016* (2013.01)

(58) Field of Classification Search
    USPC .......................................................... 219/202
    See application file for complete search history.

(56) References Cited

U.S. PATENT DOCUMENTS

| | | | | |
|---|---|---|---|---|
| 2006/0138123 | A1* | 6/2006 | Ishii | ....................... H01C 7/027 219/505 |
| 2018/0194199 | A1* | 7/2018 | Oh | ........................... H05B 3/12 |

FOREIGN PATENT DOCUMENTS

| | | |
|---|---|---|
| JP | 2019-164941 A | 9/2019 |
| KR | 10-2006-0086061 A | 7/2006 |
| KR | 10-0838919 B1 | 6/2008 |
| KR | 10-2018-0073728 A | 7/2018 |
| KR | 10-2018-0115378 A | 10/2018 |
| KR | 10-1987415 B1 | 6/2019 |
| RU | 52 550 U1 | 3/2006 |
| RU | 2 716 520 C2 | 3/2020 |

OTHER PUBLICATIONS

Korean Office Action dated Feb. 22, 2022, issued in corresponding Korean Patent Application No. 10-2020-0096077.

\* cited by examiner

HEATING FILM

CROSS REFERENCE TO RELATED APPLICATION

The present application claims priority to Korean Patent Application No. 10-2020-0096077, filed Jul. 31, 2020, the entire contents of which is incorporated herein for all purposes by this reference.

BACKGROUND OF THE INVENTION

Field of the Invention

The present invention relates to a heating film which is flexible, is easily mounted on an internal member of a vehicle, has good product quality in terms of not being deformable during production thereof, uniformly generates and distributes heat over the entire area thereof, and is safely used by cutting a current supply when a user's touch is recognized.

Description of Related Art

A radiant heater using carbon utilizes radiant heat rather than direct conduction or convective heat transfer. Specifically, since it heats with far-infrared rays, it is advantageous in local heating at a close distance.

In recent years, autonomous vehicles and the like have been developed and it has been expected that a vehicle's internal space is used for many purposes. To the present end, radiant heaters have been applied to the interior of the vehicle.

For a radiant heater of a vehicle, it is required that an internal material of a vehicle to which the radiant heater is applied naturally generates heat and it can heat a body portion of a passenger, which is difficult to be warmed by a main heating, ventilation, and an air cooling (HVAC) system of a vehicle.

To the present end, the heater may be manufactured in a film form to be easily provided on the surface of the internal material of a vehicle. However, a case where a radiant heat heater is manufactured in a film type for applications in a vehicle has not been reported.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a heating film which is flexible, is easily mounted on an internal member of a vehicle, has good product quality in terms of not being deformable during production thereof, uniformly generates and distributes heat over the entire area thereof, and is safely used by cutting current supply when a user's touch is recognized.

To accomplish the objective of the present invention, various aspects of the present invention are directed to providing a heating film including: a base layer made of a polymer resin; more than one electrode lines spaced from each other and disposed on the base layer; a mesh-type support layer disposed between the electrode lines and made of a thermally conductive material; and a heating layer with first and second ends connected to the respective electrode lines, the heating layer made of a carbon composite material and configured to generate heat when powered.

The electrode lines, the support layer, and the heating layer may be mounted on the base layer to form a stacked structure, and a cover layer made of a polymer resin may be disposed on the stacked structure.

The heating layer may cover the support layer, and the electrode lines are arranged to extend along an edge portion of the heating layer.

A touch sensor line may be arranged to extend along the edge portion of the heating layer.

The base layer may have a first extension disposed at a first end portion thereof, the first extension may be provided with an electrode connection terminal, the electrode line may extend from the electrode connection terminal to the edge portion of the heating layer, and the electrode line may receive electric current through the electrode connection terminal.

The base layer may have a second extension disposed at a second portion thereof, the second extension may be provided with a sensor connection terminal, and the touch sensor line may extend from the sensor connection terminal to an edge portion of the plurality of electrode lines.

The heating layer may have a rectangular shape.

The support layer may include a first portion and a second portion. The first portion may have larger mesh holes than the second portion. The first portion may be disposed under the heating layer.

The second portion may be disposed in an area in which the heating layer is not present between the electrode lines. An end portion of the heating layer and an end portion of the second portion of the support layer overlap so that heat transfer from the heating layer to the second portion of the support layer is facilitated.

The heating film may further include a temperature sensor that measures the temperature of the heating film. The temperature sensor may be disposed in a mesh hole of the mesh-type support layer.

The temperature sensor may be received in a recess formed in an insulating layer formed at a rear portion of the heating film.

The heating film according to various exemplary embodiments of the present invention is of a flexible film type, is easily mounted on the surface of an internal member of a vehicle, has good product quality in terms of not being deformable during production thereof, uniformly generates and distributes heat over the entire area thereof, and is safely used by cutting current supply when a user's touch is recognized.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
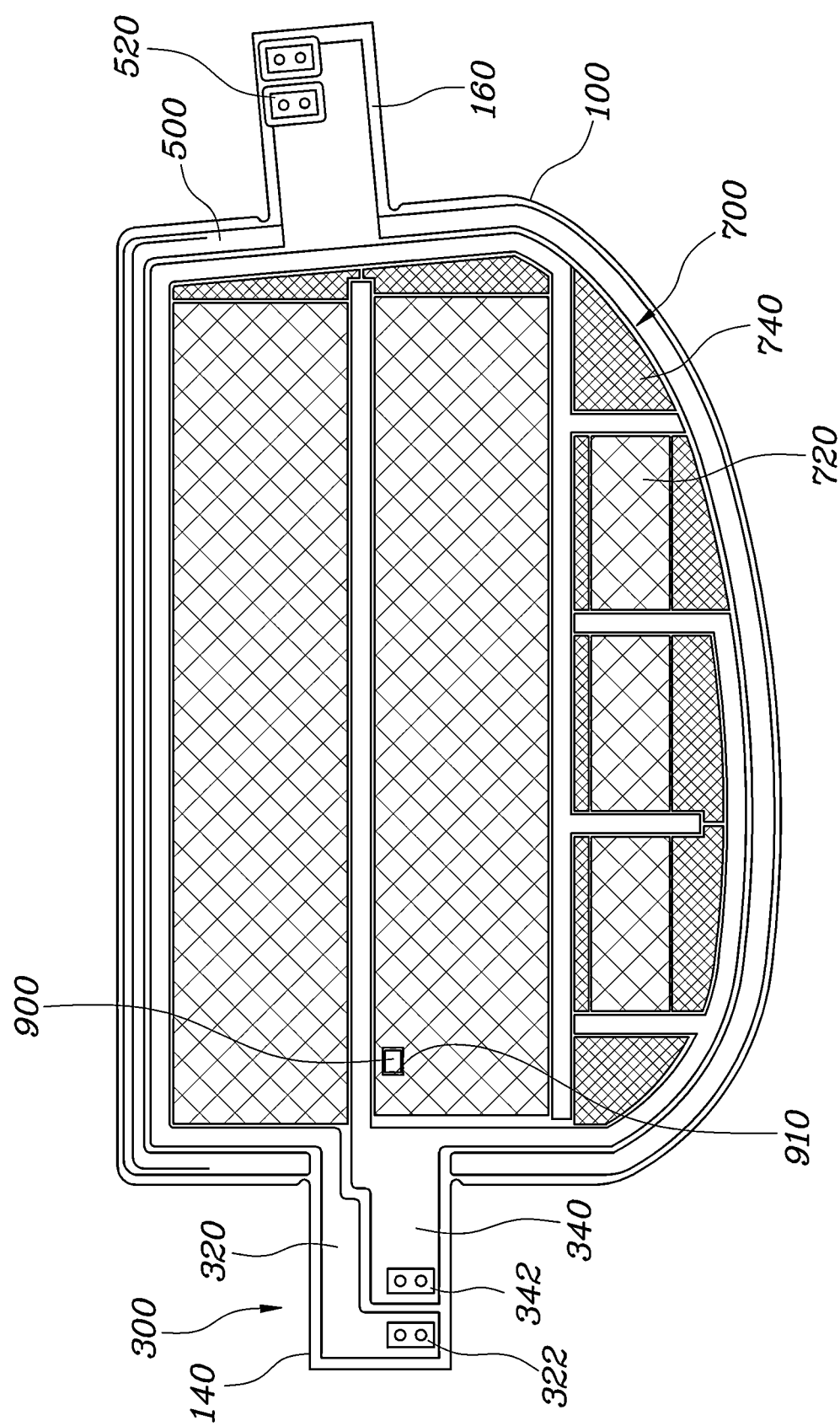
FIG. 1 is a diagram illustrating the construction of a heating film according to various exemplary embodiments of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Figure 2:
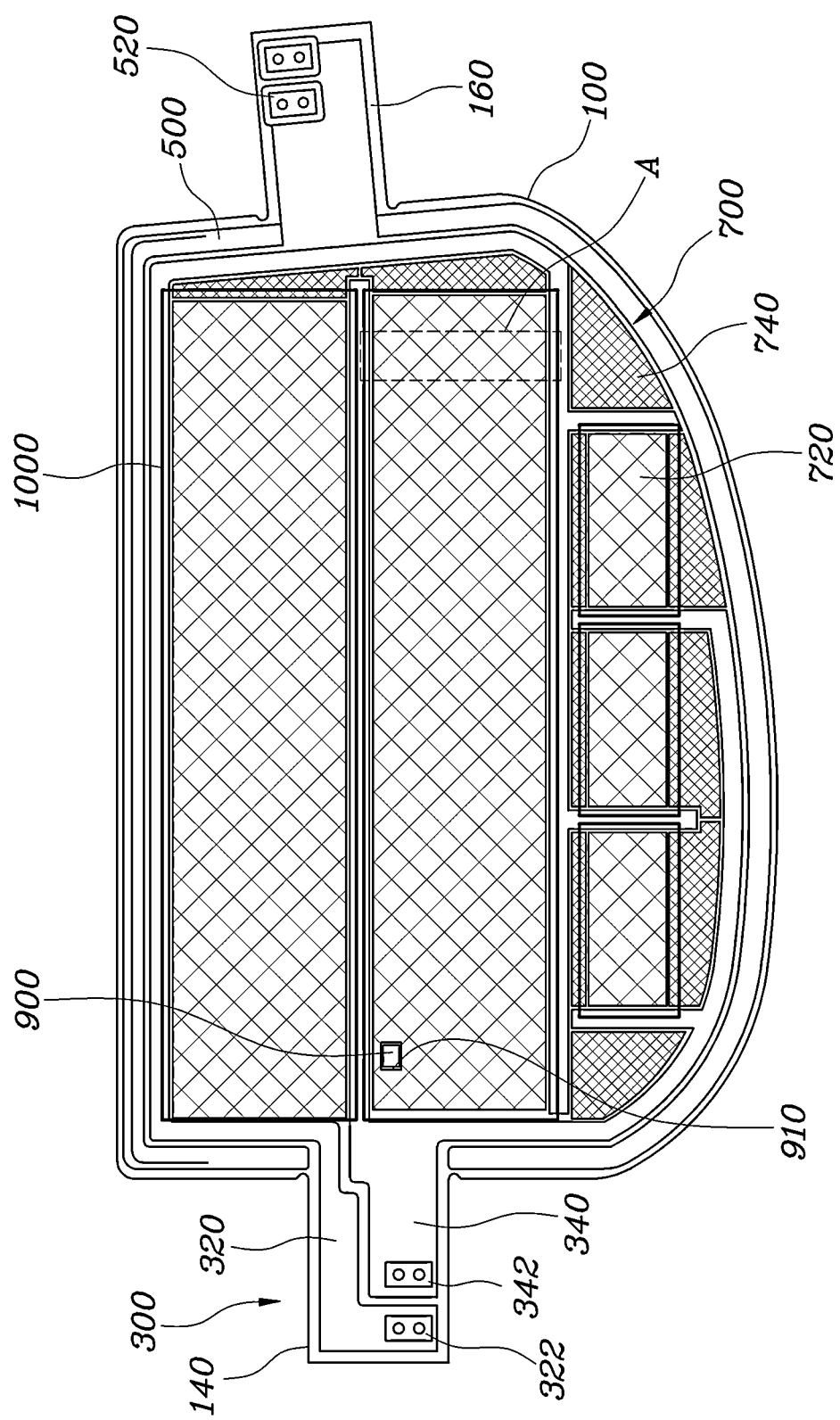
FIG. 2 is a diagram illustrating a state in which the heating film of FIG. 1 is provided with a heating layer.
Figure 3:
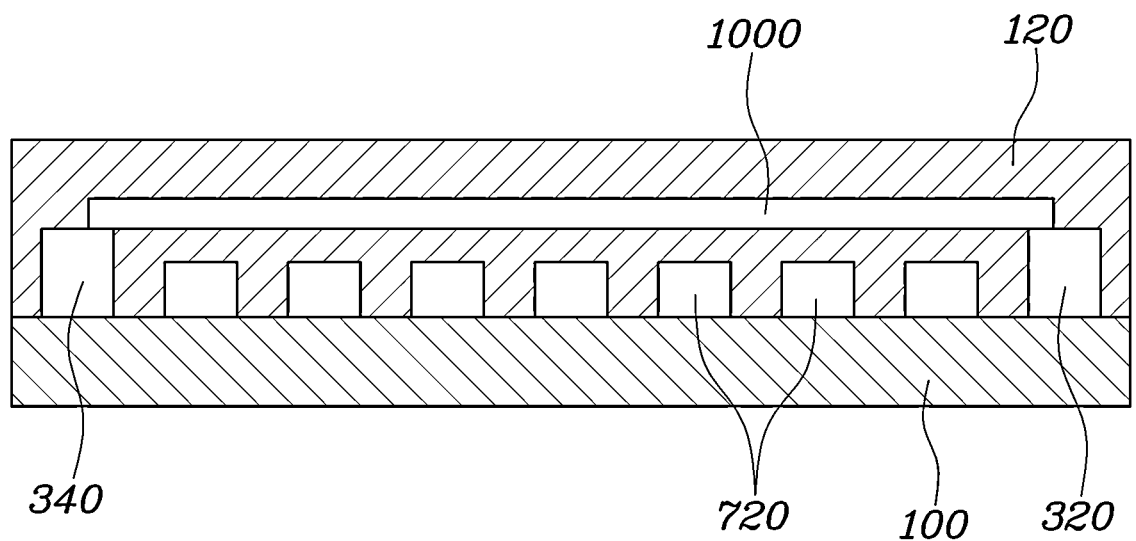
FIG. 3 is an enlarged view of a region A in FIG. 2.

FIG. 1 is a diagram illustrating the construction of a heating film according to various exemplary embodiments of the present invention; FIG. 2 is a diagram illustrating a state in which the heating film of FIG. 1 is provided with a heating layer; and FIG. 3 is an enlarged view of a region A in FIG. 2.

Hereinafter, a heating film according to various exemplary embodiments of the present invention will be described with reference to FIG. 1 and FIG. 2. According to various exemplary embodiments of the present invention, a heating film includes: a base layer 100 made of a polymer resin; a plurality of electrode lines 300 spaced from each other and disposed on the base layer 100; a mesh-type support layer 700 disposed between the electrode lines 300 and made of a thermally conductive material; and a heating layer 1000 with first and second end portions connected to the electrode lines 300, the heating layer 1000 made of a carbon composite material and configured to generate the heat when powered.

The present invention relates to a technology for manufacturing a film-type planar heating element using a method of manufacturing a flexible printed circuit board (FPCB). Furthermore, the heating film of the present invention is a heating element based on carbon (for example, a carbon nanotube (CNT) composite) and performs near-field radiant heating using far infrared rays.

Accordingly, to implement a flexible film, the base layer 100 is made of a polymer resin material and is manufactured in a form of a thin film. The base layer 100 is made of a polymer resin material because it needs to be flexible and insulating. An exemplary material of the base layer 100 is a polyimide (PI)-based resin.

Components required for heating are disposed on the base layer 100. Electrodes to supply current are disposed on the base layer 100. As illustrated in the figures, a positive electrode and a negative electrode are disposed. The electrode lines 300 are strip-shaped electrodes such as wirings on a FPCB. Furthermore, since the heating layer 1000 needs to be disposed between a positive electrode line 320 and a negative electrode line 340, the positive and negative electrode lines 320 and 340 are disposed along the edge portion of the base layer 100.

The electrode lines 300 are spaced from each other on the base layer 100. For example, the positive electrode line 320 of the electrode lines extends upward (i.e., bent upward) from the base layer 100, horizontally extends along an upper edge portion, and extends downward (i.e., bent downward). The negative electrode line 340 is bent downward and extends along a lower edge portion of the base layer 100. The positive electrode line 320 and the negative electrode line 340 are arranged to face each other, and each of the positive and negative electrode lines 320 and 340 may be divided into branches.

The heating layer 1000 is disposed between the electrode lines 300. FIG. 2 is a diagram illustrating the arrangement of the heating layer 1000. The respective end portions corresponding to a first end portion and a second end portion of the heating layer 1000 are connected to the electrode lines 300 so that electric current can flow. To uniformly generate heat in each of the heating layers 1000, a portion of the electrode line 300 connected to the heating layer 1000 has a straight-line shape, and the heating layer 1000 has a rectangular shape. The positive electrode line 320 and the negative electrode line 340 with the heating layer 1000 interposed therebetween are in parallel to each other.

This prevents a phenomenon that heating is locally concentrated, ensuring product safety. Furthermore, it enables heat to be evenly radiated over the entire area of the heating layer, improving product quality.

The electrode lines and the heating layer are first formed on the base layer 100 which is made of resin, and a cover layer 120 is then formed on the top portion of the structure including the base layer 100, the electrode lines, and the heating layer. The production process of the heating film involves heating and cooling cycles, and the layers have different thermal expansion coefficients. Therefore, a conventional method of manufacturing a heating film has a problem in that the heating film is bent or deformed during the production. To solve the present problem, according to various exemplary embodiments of the present invention, the heating film is provided with the support layer 700 which is configured as a reinforcement member rather than as a current conduction member, facilitating the heating film to maintain a planar shape. The support layer 700 is also configured to evenly conduct the heat over the entire area of the heating film.

The support layer 700 is disposed between the electrode lines 300, is made of a thermally conductive material, and is formed in a mesh shape. As illustrated in FIG. 1, the support layer 700 is disposed between each of the electrode lines 300. Furthermore, as shown in FIG. 2, the heating layer 1000 is positioned above the support layer 700. That is, the heating layer 1000 is configured to cover the support layer 700, and the support layer 700 imparts rigidity to maintain the shape of the flat-shaped heating film. Therefore, the support layer 700 is made of a metallic material through which heat may be transferred. That is, the support layer 700 is sufficiently rigid and thermally conductive. Furthermore, the support layer 700 is formed in a mesh shape to reinforce the heating film while not substantially increasing the weight of the heating film.

The support layer 700 includes a first portion 720 and a second portion 740. The first portion 720 has a larger mesh hole size than the second portion 740 and is disposed under the heating layer 1000. The second portion 740 is positioned in an area where the heating layer 1000 is not present and is disposed between the electrode lines 300. The first portion 720 having a relatively large mesh hole size is disposed in an area in which the heating layer 1000 is present. Furthermore, the second portion 740 having a relatively small mesh hole size is disposed in the remaining area which is near the edge portion of the base layer and in which the heating layer 1000 is not provided. Thus, the heat transfer area is increased, well distributing the heat even to the corners of the heating film. An end portion of the second portion 740 of the support layer 700 and an end portion of the heating layer 1000 overlap so that heat may be well transferred from the heating layer 1000 to the second portion 740 of the support layer 700.

As illustrated in FIG. 2, the heating layer 1000 is disposed on the first portion 720 of the support layer 700, which has a larger mesh hole size, but is not disposed on the second portion 740 which has a smaller mesh hole size. However, the heating layer 1000 is formed to overlap an end portion of the second portion 740 of the support layer 700 for better heat transfer.

FIG. 3 illustrates a cross-sectional view of a region A of FIG. 2. Referring to FIG. 3, the electrode lines 300 and the second portion 720 of the support layer 700 are mounted on the base layer 100, and then the heating layer 1000 is mounted thereon. The heating layer 1000 is in contact with the electrode lines 300 and is not in contact with the support layer 700. When electric current flows through the heating layer 1000, resistance heat is generated in the heating layer 1000. The support layer 700 does not allow electric conduction but is configured to uniformly spread and transfer the heat generated in the heating layer 1000. A cover layer 120 is disposed on the top portion of the structure including the base layer, the support layer, and the electrode lines to protect the structure.

That is, after the electrode lines 300, the support layer 700, and the heating layer 1000 are mounted on the base layer 100, the cover layer 120 made of polymer resin is then mounted thereon. The heating layer 1000 is mounted to cover the support layer 700, and the electrode lines 300 are disposed along the edge portion of the heating layer 1000.

As shown in FIGS. 1 to 2, a touch sensor line 500 is disposed along the edge portions of the respective electrode lines 300. The base layer 100 has a first extension 140 at a first end portion thereof, and the first extension 140 is provided with electrode connection terminal 322 and 342. The electrode lines 300 extend from the electrode connection terminals 322 and 342 to the edge portion of the heating layer 1000. The electrode lines 300 is powered through the electrode connection terminals 322 and 342. The base layer has a second extension 160 at a second end portion thereof, and the second extension 160 is provided with sensor connection terminals 520. The touch sensor line 500 extends from the sensor connection terminals 520 to the edge portions of the electrode lines 300.

Due to the presence of the touch sensor line 500, when the heating film is touched by a body portion of a user, the user's touch may be detected. When the user's touch is detected, the current flowing to the electrode lines is interrupted, protecting the user against possible safety accidents.

The heating film optionally includes a temperature sensor 900 that measures the temperature of the heating film. The temperature sensor 900 is disposed at the center portion within a mesh hole of the mesh-type support layer. The temperature sensor 900 is nested in a recess 910 formed in an insulating layer formed at a rear portion of the heating film.

The temperature sensor 900 measures the temperature of the heating film, and the current supply to the electrode lines is controlled on the basis of the measured temperature, so that the temperature of the heating film is regulated within a predetermined range. Since the temperature sensor is disposed in the center portion of a mesh hole of the mesh grid forming the heating layer 1000, the temperature of the heating film may be accurately measured. The heating film of the present invention is provided to surround an internal member of a vehicle, forming the surface of the internal member of the vehicle. The temperature sensor 900 is fitted into a recess 910 formed in an insulating material of the internal member, is positioned in the middle portion of a mesh hole of the heating layer 1000, and is covered by the cover layer. Therefore, the temperature sensor 900 does not protrude from the surface of the heating film. That is, the heating film has an even surface.

Furthermore, the first extension 140 and the second extension 160 are not portions that are used to surround the internal member but are provided in a form of extensions extending from the internal member. Therefore, the heating film is very easy to install. Furthermore, the electrode connection terminals and the sensor connection terminals are separately bent and wrapped, and are inserted into the internal member so as not to be exposed outside.

The heating film according to various exemplary embodiments of the present invention is of a flexible film type, being easily mountable on the surface of an internal member of a vehicle. Furthermore, the heating film has good product quality because it is not deformable during the production process thereof, can uniformly generate and distribute heat over the entire area thereof, and may be safely used by stopping current supply when a user's touch is recognized.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A heating film comprising:
a base layer made of polymer resin;
a plurality of electrode lines spaced from each other and disposed on the base layer;
a support layer disposed between the plurality of electrode lines and made of a thermally conductive material; and
a heating layer having a first end portion and a second end portion connected to a corresponding electrode among the plurality of electrode lines, respectively, the heating layer being made of a carbon composite material and being configured to generate heat when electric current is supplied to the heating layer, wherein the support layer is formed of a plurality of mesh holes, wherein the support layer includes a first portion and a second portion, wherein the first portion has a mesh hole larger than a mesh hole of the second portion, and wherein the first portion is disposed under the heating layer.

2. The heating film according to claim 1, wherein the plurality of electrode lines, the support layer, and the heating layer are mounted on the base layer to form a stacked structure, and a cover layer made of polymer resin is disposed on the stacked structure.

3. The heating film according to claim 2, wherein the heating layer is disposed to be not in direct contact with the support layer.

4. The heating film according to claim 1, wherein the heating layer covers the support layer, and the plurality of electrode lines is arranged to extend along an edge portion of the heating layer.

5. The heating film according to claim 4, wherein a touch sensor line is arranged to extend along the edge portion of the heating layer.

6. The heating film according to claim 5, wherein the base layer has a first extension at a first end portion of the base layer, the first extension is provided with an electrode connection terminal, the plurality of electrode lines extend from the electrode connection terminal to the edge portion of the heating layer, and the plurality of electrode lines is supplied with the electric current through the electrode connection terminal.

7. The heating film according to claim 5, wherein the base layer has a second extension at a second end portion of the base layer, the second extension is provided with a sensor connection terminal, and the touch sensor line is disposed to extend from the sensor connection terminal to an edge portion of the plurality of electrode lines.

8. The heating film according to claim 1, wherein the heating layer has a rectangular shape.

9. The heating film according to claim 8, wherein a portion of the plurality of electrode lines connected to the heating layer is in a shape of a straight line.

10. The heating film according to claim 1, wherein the second portion is disposed between the plurality of electrode lines in an area in which the heating layer is not present between the plurality of electrode lines.

11. The heating film according to claim 1, wherein an end portion of the second portion is disposed to overlap the heating layer so as to facilitate heat transfer from the heating layer to the second portion.

12. The heating film according to claim 1, further including:

a temperature sensor configured to measure a temperature of the heating film, wherein the temperature sensor is disposed in a mesh hole of the support layer.

13. The heating film according to claim 12, wherein the temperature sensor is disposed in the mesh hole of the first portion in the support layer.

14. The heating film according to claim 13, wherein the temperature sensor is covered by a cover layer so that the temperature sensor does not protrude from a surface of the heating film.

15. The heating film according to claim 12, wherein the temperature sensor is received in a recess formed in an insulating layer formed at a rear portion of the heating film.

* * * * *